US011424723B2

(12) United States Patent
Faulstich

(10) Patent No.: US 11,424,723 B2
(45) Date of Patent: *Aug. 23, 2022

(54) POWER LIMITER CONFIGURATION FOR AUDIO SIGNALS

(71) Applicant: Biamp Systems, LLC, Beaverton, OR (US)

(72) Inventor: Aaron Faulstich, Beaverton, OR (US)

(73) Assignee: Biamp Systems, LLC, Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/721,822

(22) Filed: Dec. 19, 2019

(65) Prior Publication Data

US 2020/0252723 A1 Aug. 6, 2020

Related U.S. Application Data

(60) Provisional application No. 62/800,807, filed on Feb. 4, 2019.

(51) Int. Cl.
| | | |
|---|---|---|
| *H03F 1/32* | (2006.01) | |
| *G10L 25/21* | (2013.01) | |
| *H03G 3/30* | (2006.01) | |
| *H03G 11/00* | (2006.01) | |
| *H04R 3/00* | (2006.01) | |
| *H04R 3/02* | (2006.01) | |
| *H04R 3/04* | (2006.01) | |

(52) U.S. Cl.
CPC ............ *H03F 1/3264* (2013.01); *G10L 25/21* (2013.01); *H03G 3/3005* (2013.01); *H03G 11/008* (2013.01); *H04R 3/007* (2013.01); *H04R 3/02* (2013.01); *H04R 3/04* (2013.01); *H03G 2201/106* (2013.01)

(58) Field of Classification Search
CPC . H04R 3/04; H04R 3/02; H04R 3/007; H03G 3/3005; H03G 3/32; H03G 3/34; H03G 2201/106; H03G 11/008; H03F 1/3264; G10L 25/21
USPC .. 381/93, 83, 318, 99, 98, 95, 96, 108, 107, 381/121, 120
See application file for complete search history.

(56) References Cited

U.S. PATENT DOCUMENTS

| | | |
|---|---|---|
| 2,817,715 A | 12/1957 | Blake |
| 4,377,792 A | 3/1983 | Blackmer et al. |
| 7,016,509 B1 | 3/2006 | Bharitkar et al. |
| 8,918,326 B1 | 12/2014 | Blesser |
| 10,826,441 B2 | 11/2020 | Faulstich |
| 11,146,219 B2 | 10/2021 | Faulstich |
| 2001/0009391 A1 | 7/2001 | Kawada et al. |
| 2003/0117212 A1* | 6/2003 | Krishnapura ......... H03F 1/0266 327/552 |

(Continued)

*Primary Examiner* — Vivian C Chin
*Assistant Examiner* — Con P Tran

(57) ABSTRACT

Example embodiments provide a process that includes one or more of receiving an audio signal from a feedback path of a feedback compressor circuit, determining whether an auxiliary attenuation value applied to the feedback compressor circuit has changed since a last audio signal was received, responsive to determining the auxiliary value has changed, determining a current operational state value of the LPF needs to be modified based on the changed auxiliary attenuation value, modifying the operational state value of the LPF, and applying the audio signal to the modified LPF.

17 Claims, 11 Drawing Sheets

(56) References Cited

U.S. PATENT DOCUMENTS

| | | |
|---|---|---|
| 2007/0176815 A1 | 8/2007 | Kost |
| 2008/0278230 A1 | 11/2008 | Kost et al. |
| 2010/0246848 A1 | 9/2010 | Stanley |
| 2011/0228945 A1* | 9/2011 | Mihelich ............... H04R 3/002 381/59 |
| 2012/0230513 A1 | 9/2012 | Yoneda |
| 2015/0214902 A1 | 7/2015 | Lin |
| 2015/0304772 A1 | 10/2015 | Risberg et al. |
| 2015/0350783 A1 | 12/2015 | Krishnaswamy et al. |
| 2016/0249135 A1 | 8/2016 | Savvopoulos et al. |
| 2017/0250662 A1 | 8/2017 | Cope et al. |
| 2018/0034427 A1 | 2/2018 | Mostert |
| 2018/0351523 A1 | 12/2018 | Lesso |
| 2019/0028069 A1 | 1/2019 | Watanabe |

* cited by examiner

POWER LIMITER CONFIGURATION FOR AUDIO SIGNALS

BACKGROUND OF THE INVENTION

A power limiter circuit configuration may utilize a feedback compressor architecture. Within such a configuration, an output amplitude is monitored and compared against a threshold in the log domain. When the output amplitude exceeds the threshold, the difference, in decibels, is measured and multiplied by a constant loop gain to determine an attenuation amount. That attenuation is converted to a linear scale factor, is low-pass filtered, and applied to the input signal. The time constant of the low-pass filter determines how quickly signal compression is applied and released.

One reason for a feedback compressor, rather than a feedforward compressor, is that the relationship between amplitude and output power is complex. The load impedance will vary with frequency, so the power dissipation, based on voltage, will vary with frequency as well. An attempt to predict output power by modelling the load could be performed, but that would be computationally expensive and incur latency. A feedback compressor permits the measurement of the true output power from voltage and current measurements without needing to determine the load.

Sensing circuits measure output voltage and current, and the results are converted to digital using audio ND converters. The digital values of voltage and current are multiplied to calculate power for the feedback path.

Amplifier output power is specified based on being able to output a sinewave burst output waveform without attenuating or distorting the signal. The burst signal waveform alternates repeatedly between rated RMS output power for a short duration of time (typically 20-25 ms) and low power for a much longer duration (typically hundreds of milliseconds). Because more time is spent at the lower power level, the overall average power is much less than the burst rating. For example, a 1200 W burst may only average 300 W of continuous output. Power limiting should permit a 1200 W burst in order to call the product a 1200 W amplifier.

For a simple compressor used for a 300 W limit and receiving a 1200 W burst, the burst waveform will fail to pass unattenuated even if the average power of the burst over time is less than 300 W. That is because attenuation starts to be applied as soon as the output is over 300 W for any point in time.

SUMMARY OF THE INVENTION

The present application relates to a method that includes one or more of receiving an audio signal at a feedback compressor circuit, determining how much to attenuate the audio signal when a power level of the audio signal exceeds a threshold power level, combining the audio signal with an auxiliary attenuation signal from an auxiliary attenuation source and a compressed attenuation signal from the feedback compressor circuit to create a combination signal, and generating an audio output signal of the feedback compressor circuit based on the combination signal.

Another example embodiment may include an apparatus that includes a receiver configured to receive an audio signal at a feedback compressor circuit, and a processor configured to determine how much to attenuate the audio signal when a power level of the audio signal exceeds a threshold power level, combine the audio signal with an auxiliary attenuation signal from an auxiliary attenuation source and a compressed attenuation signal from the feedback compressor circuit to create a combination signal, and generate an audio output signal of the feedback compressor circuit based on the combination signal.

Still yet another example embodiment may include a gate array configured to perform receiving an audio signal at a feedback compressor circuit, determining how much to attenuate the audio signal when a power level of the audio signal exceeds a threshold power level, combining the audio signal with an auxiliary attenuation signal from an auxiliary attenuation source and a compressed attenuation signal from the feedback compressor circuit to create a combination signal, and generating an audio output signal of the feedback compressor circuit based on the combination signal.

Still yet a further example embodiment may include a non-transitory computer readable storage medium configured to store instructions that when executed cause a processor to perform one or more of receiving an audio signal at a feedback compressor circuit, receiving an auxiliary attenuation signal from an auxiliary attenuation source, determining a threshold power level based on a value of the auxiliary attenuation signal, determining an output power level of the audio signal exceeds the threshold power level, combining the audio signal with the auxiliary attenuation signal from the auxiliary attenuation source and a compressed attenuation signal from the feedback compressor circuit to create a combination signal, and generating an audio output signal of the feedback compressor circuit based on the combination signal.

Still yet a further example embodiment may include an apparatus that includes a receiver configured to receive an audio signal at a feedback compressor circuit, receive an auxiliary attenuation signal from an auxiliary attenuation source, and a processor configured to determine a threshold power level based on a value of the auxiliary attenuation signal, determine an output power level of the audio signal exceeds the threshold power level, combine the audio signal with the auxiliary attenuation signal from the auxiliary attenuation source and a compressed attenuation signal from the feedback compressor circuit to create a combination signal, and generate an audio output signal of the feedback compressor circuit based on the combination signal.

Still yet another example embodiment may include a non-transitory computer readable storage medium configured to store instructions that when executed cause a processor to perform one or more of receiving an audio signal at a feedback compressor circuit, receiving an auxiliary attenuation signal from an auxiliary attenuation source, determining a threshold power level based on a value of the auxiliary attenuation signal, determining an output power level of the audio signal exceeds the threshold power level, combining the audio signal with the auxiliary attenuation signal from the auxiliary attenuation source and a compressed attenuation signal from the feedback compressor circuit to create a combination signal, and generating an audio output signal of the feedback compressor circuit based on the combination signal.

Another example embodiment may include a method that includes receiving an audio signal from a feedback path of a feedback compressor circuit, determining whether an auxiliary attenuation value applied to the feedback compressor circuit has changed since a last audio signal was received, responsive to determining the auxiliary value has changed, determining a current operational state value of the LPF needs to be modified based on the changed auxiliary attenuation value, modifying the operational state value of the LPF, and applying the audio signal to the modified LPF.

Still another example embodiment may include an apparatus that includes a receiver configured to receive an audio signal from a feedback path of a feedback compressor circuit, and a processor configured to determine whether an auxiliary attenuation value applied to the feedback compressor circuit has changed since a last audio signal was received, responsive to the determination that the auxiliary value has changed, determine a current operational state value of the LPF needs to be modified based on the changed auxiliary attenuation value, modify the operational state value of the LPF, and apply the audio signal to the modified LPF.

Still yet another example embodiment may include a non-transitory computer readable storage medium configured to store instructions that when executed cause a processor to perform one or more of receiving an audio signal from a feedback path of a feedback compressor circuit, determining whether an auxiliary attenuation value applied to the feedback compressor circuit has changed since a last audio signal was received, responsive to determining the auxiliary value has changed, determining a current operational state value of the LPF needs to be modified based on the changed auxiliary attenuation value, modifying the operational state value of the LPF, and applying the audio signal to the modified LPF.

Yet another example embodiment may include a method that includes one or more of receiving an audio signal at a feedback compressor circuit, multiplying the received audio signal with a power feedback signal to create a product audio signal, wherein the feedback signal comprises a low-pass filtered signal, applying a power amplifier to the product audio signal, and providing the amplified product audio signal as an output signal to a speaker.

Still another example embodiment may include an apparatus that includes a receiver configured to receive an audio signal at a feedback compressor circuit, a processor configured to multiply the received audio signal with a power feedback signal to create a product audio signal, and the feedback signal includes a low-pass filtered signal, apply a power amplifier to the product audio signal, and provide the amplified product audio signal as an output signal to a speaker.

Still yet another further example may include a non-transitory computer readable storage medium configured to store instructions that when executed cause a processor to perform one or more of receiving an audio signal at a feedback compressor circuit, multiplying the received audio signal with a power feedback signal to create a product audio signal, wherein the feedback signal comprises a low-pass filtered signal, applying a power amplifier to the product audio signal, and providing the amplified product audio signal as an output signal to a speaker.

DETAILED DESCRIPTION

Example embodiments include circuit configurations illustrated as logical systems and modules which perform certain tasks and operations to process data, such as an audio input signal and provide a modified output signal. Such configurations may support additional and/or fast attenuation sources, and enabled and disabled compression for a stored energy approach.

A load impedance will vary with frequency, and thus the power dissipation based on voltage will also vary with frequency. A feedback compressor permits measuring a true output power from voltage and current measurements without requiring information about the load.

Figure 1:
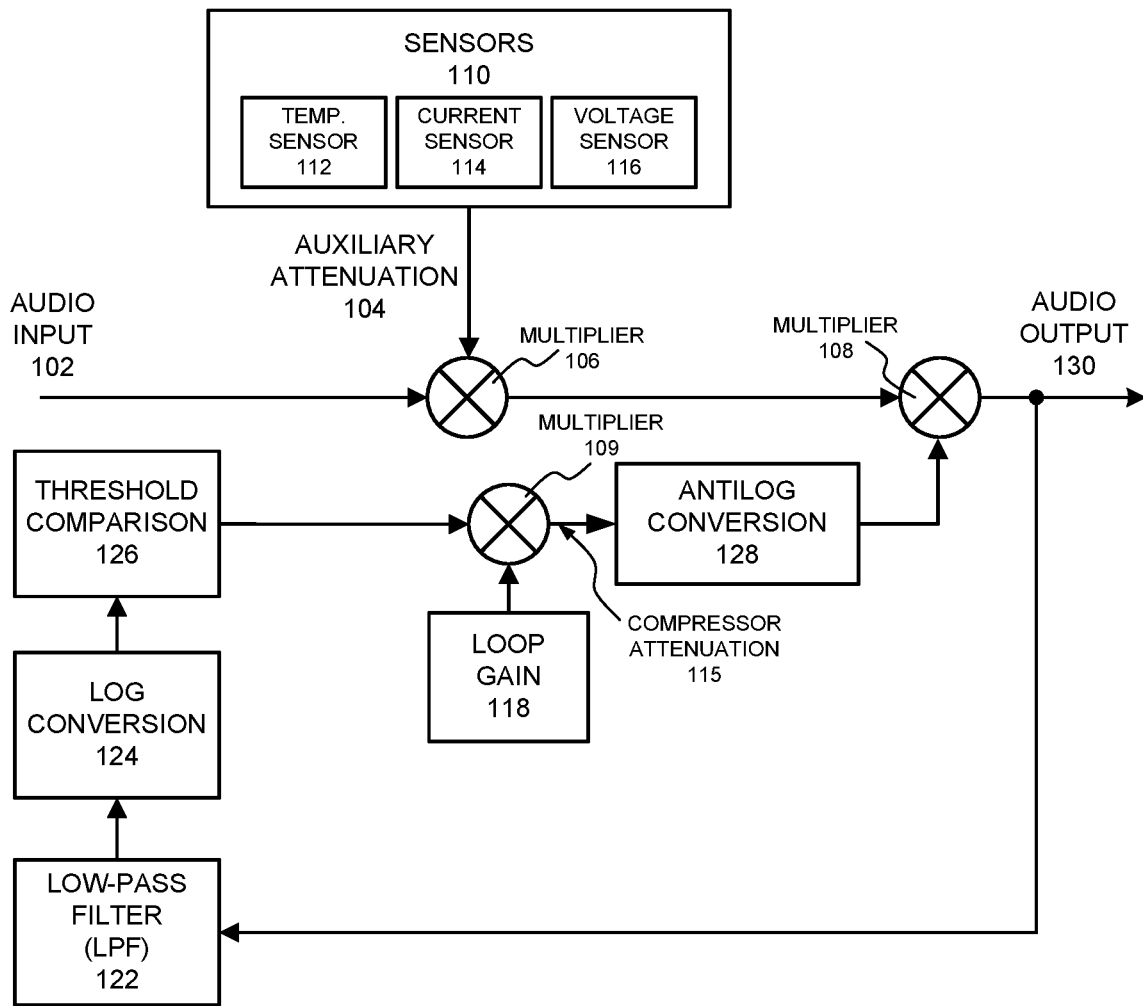
FIG. 1 illustrates a block diagram of a feedback compressor circuit for burst power waveforms according to example embodiments.

FIG. 1 illustrates a block diagram of a feedback compressor circuit for burst power waveforms according to example embodiments. Referring to FIG. 1, the configuration or 'circuit' 100 may include an audio input 102, such as audio data from an audio source, which is multiplied by an external data source, such as sensors 110 which measure attenuation caused by any one or more of a temperature sensor 112, a current sensor 114 and/or a voltage sensor 116. The combination of one or more of those sensor sources may be combined into an auxiliary attenuation source 104 combined at multiplier 106. The result is multiplied, via multiplier 108, with feedback from the compressor circuit which includes an audio power measurement signal that has been filtered via a LPF 122, converted to a logarithmic scale 124 and which is compared to a threshold 126 to determine whether the output power is exceeding the threshold 126 to create a burst preserving feedback (BPF) loop.

Having the low-pass filter to the beginning of the circuit feedback chain provides that attenuation will not be applied immediately in response to output power changes. Because the low-pass filter smooths the power measurement to calculate an average, the filter output lags the actual output power. The lag permits a passed burst test, since the filter will not charge up to the limiter threshold during short bursts. By placing the low-pass filter in the front of the feedback chain, burst power waveforms are preserved by the amplifier compressor circuit.

Figure 2:
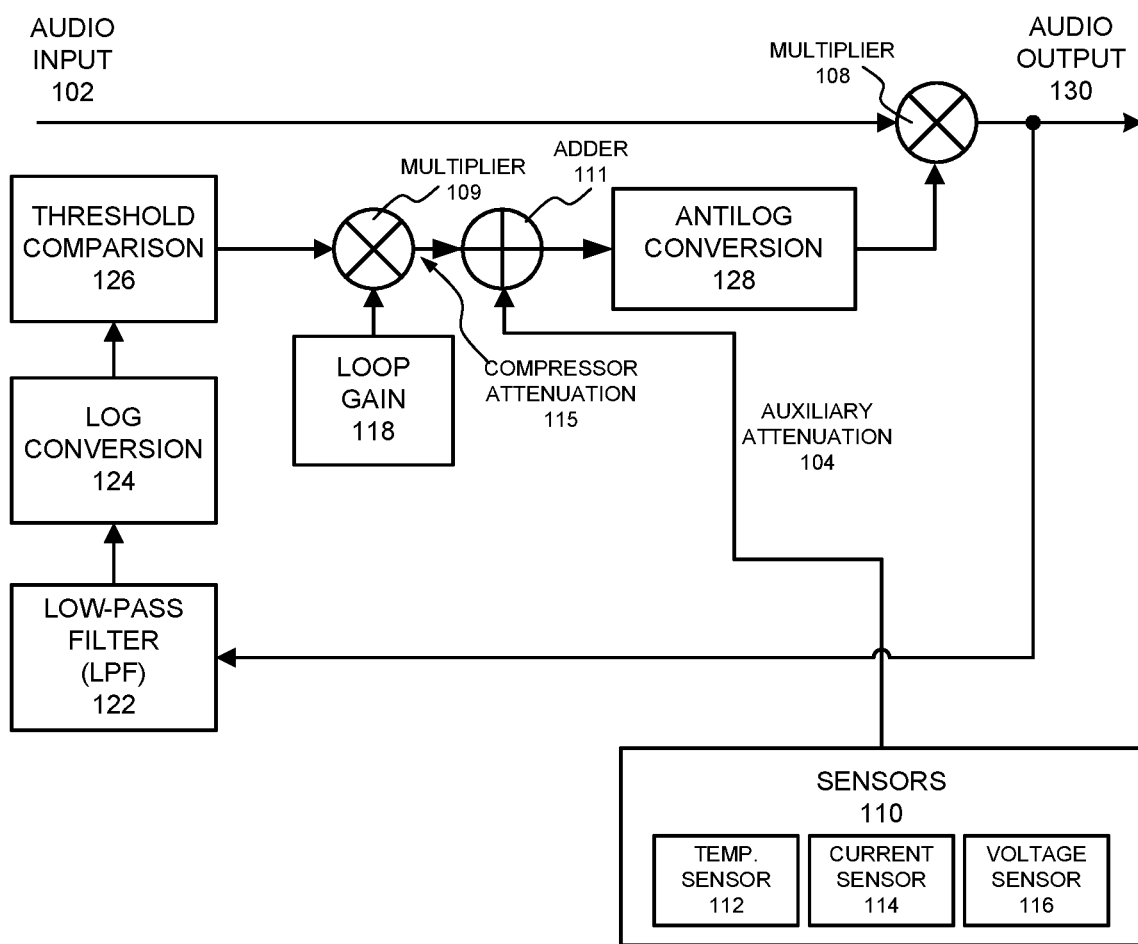
FIG. 2 illustrates a block diagram of a feedback compressor circuit for burst power waveforms with auxiliary attenuation being added to the compressor attenuation according to example embodiments.

In the configuration of FIG. 1, the audio input signal is multiplied twice, once by the auxiliary attenuation 104 via multiplier 106 and once by the compressor attenuation 115 (i.e., multiplier 109). The output may be converted back to the linear domain via antilog conversion module 128. A loop gain 118 of the feedback loop is applied to the filtered audio signal. Loop gain is a standard part of a feedback compressor circuit for controlling the compression ratio, which is the severity of the attenuation applied. For example, a compressor with a ratio of 10:1 will attenuate a signal 10 dB over the threshold down to a level of 1 dB over the threshold. Increasing the loop gain increases the compression ratio. For purposes of this disclosure, it may be assumed the loop gain is a constant value which can be changed to achieve a higher compression ratio. One approach is to convert the auxiliary attenuation value into the log domain and add it to the compressor attenuation directly since multiplication in the linear domain is equivalent to addition in the log domain. Both FIGS. 1 and 2 are functionally equivalent since they both represent two gain values (i.e., compressor attenuation 115 and auxiliary attenuation 104) being applied to the audio input signal to produce the audio output signal 130. The audio output signal 130 may be the same as the input signal 102 or may be an attenuated version of the input signal. As long as the amplifier average output power is below a configurable threshold value then the output signal will be a copy of the input signal. When the amplifier average output power exceeds the configurable threshold then the output signal will be an attenuated version of the input signal that reduces the average output power to the configurable threshold. The output signal 130 will also be an attenuated version of the input signal if the auxiliary attenuation 104 is greater than zero. In one example, 6 dB of auxiliary attenuation indicates that the output will be the input signal 102 multiplied by 0.5.

FIG. 2 illustrates a block diagram of a feedback compressor circuit for burst power waveforms with auxiliary attenuation being added to the compressor attenuation according to example embodiments. Referring to FIG. 2, the configuration 200 provides a similar configuration to FIG. 1, however, the adder 111 adds the auxiliary attenuation 104 directly to the compressor attenuation 115. This alternative produces a same output audio signal 130. The "hold-off" time where no compression is applied is directly related to the filter time constant. Long burst signals cannot pass through without making the filter time constant long, and detection of faults cannot be made quickly without making the filter time constant short.

The filter is the digital equivalent of a simple resistor/capacitor (RC) low-pass filter (LPF). The filter is an exponential average with a fixed time constant. For example purposes, embodiments may be using a simple form of exponential smoothing. In this example, the filter time constant was tuned empirically so that the overall design would not attenuate a burst test waveform but would protect from high power exceeding about 100 ms. The filter time constant may be adjusted if needed. Also, the filter time constant may be dynamically varied to optimize audio distortion performance.

Figure 3:
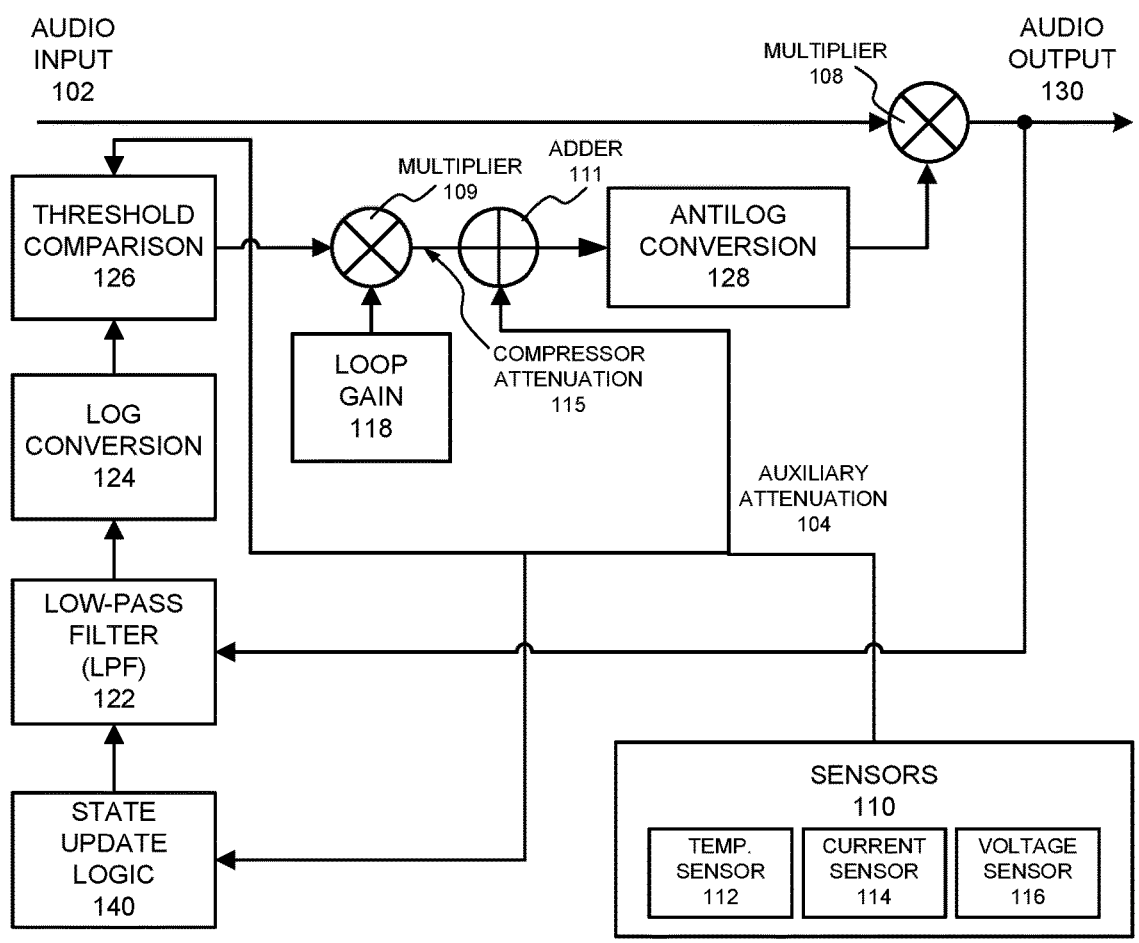
FIG. 3 illustrates a block diagram of a feedback compressor circuit for burst power waveforms with a state update logic module used to manage auxiliary attenuation value and operation of a low-pass filter according to example embodiments.

FIG. 3 illustrates a block diagram of a feedback compressor circuit for burst power waveforms with a state update logic module used to manage auxiliary attenuation value and operation of a low-pass filter according to example embodiments. Referring to FIG. 3, the configuration 300 introduces a state update logic module 140 which provides a control feature to control the operation of the LPF 122. Also, the threshold comparison operation 126 has a dynamic feature to adjust the threshold based on the auxiliary attenuation 104. For example, the threshold comparison 126 identifies an input signal and a threshold. The output is the amount that the input exceeds the threshold. In one example, If (input>threshold), then output=input−threshold; or else the output=0.

In one example, to guarantee that 3 dB of auxiliary attenuation is applied on top of existing compression attenuation, and does not cause the compressor to release, the threshold is adjusted by the auxiliary attenuation amount. If the compressor loop circuit is actively compressing and the value of auxiliary attenuation changes, the compressor loop may overcorrect. This is because auxiliary attenuation changes the threshold instantaneously, and the threshold is being compared with the slow-moving output of the low-pass filter. For example, if the compressor control loop has a time constant (Tc) of 100 ms, and the compressor loop is applying 3 dB of attenuation (compressor attenuation), and the auxiliary attenuation increases by 1 dB, then the next threshold comparison will have a result 1 dB greater than the previous sample. The 1 dB change is multiplied by the loop gain and turns into a 20 dB change. The 20 dB change is applied until the 100 ms control loop catches up with the change in applied power. The actual attenuation will settle to the desired attenuation level eventually, but there are massive overcorrections due to the threshold changing. Slowing down the auxiliary attenuation changes is not an option since there are cases where the auxiliary attenuation must be applied quickly. For example, a response to clipping may be needed within 15 ms, which is too fast for the control loop to compensate. As a result, changes must be detected in the auxiliary attenuation, and then applied to the state of the low-pass filter (LPF) 122 in the control loop. If the auxiliary attenuation changes by 1 dB, the filter state must be changed by 1 dB as well. This keeps the filter state synchronized with the auxiliary attenuation so that the threshold comparison output does not jump in response to an auxiliary attenuation change.

With regard to threshold changes, prior to auxiliary attenuation changes, the threshold itself is specifically the maximum average output power that is desired to be permitted. The negative feedback loop formed by the compressor will keep the actual average output power at or below that particular limit. For example, if 100 W continuous output power is desired, the threshold may be configured based on 100 W. Since the compressor expression operates in the log domain, 100 W is converted into the log domain as: $10*\log 10(100\ W)=20.0$. So, the 100 W threshold prior to auxiliary attenuation is 20.0. The auxiliary attenuation is a value in decibels, such as 3.0 dB. Decibels are already a log domain unit, so they do not need any conversion. Since the auxiliary attenuation and the threshold are both in the log domain, calculating the new threshold adjusted for auxiliary attenuation is a simple subtraction: Thresholdnew=Threshold−AuxAttenuation; Thresholdnew=20.0−3.0; Thresholdnew=17.0.

Figure 4:
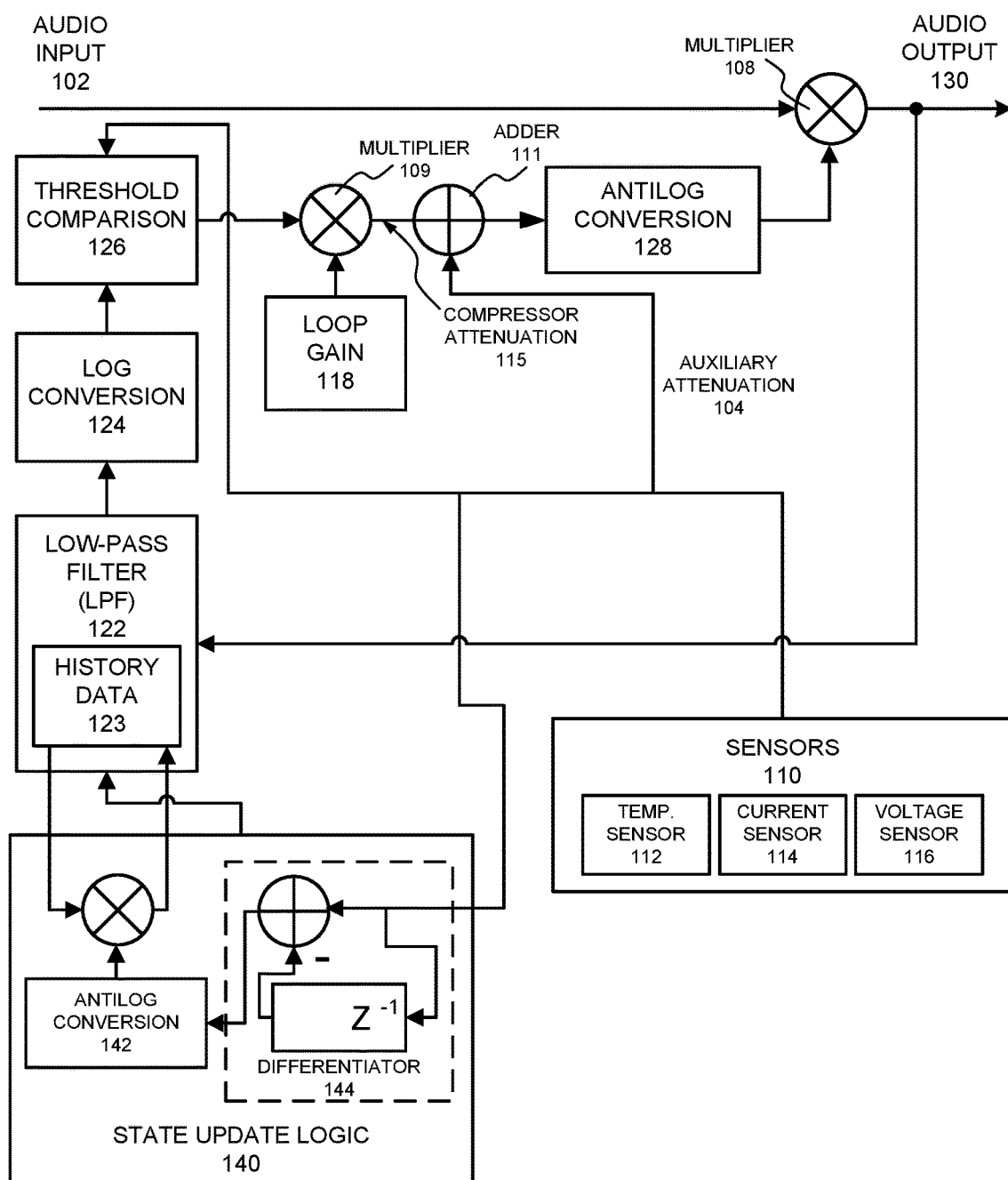
FIG. 4 illustrates a block diagram of a feedback compressor circuit for burst power waveforms with a detailed example of the state update logic module according to example embodiments.

FIG. 4 illustrates a block diagram of a feedback compressor circuit for burst power waveforms with a detailed example of the state update logic module according to example embodiments. Referring to FIG. 4, the configuration 400 provides additional details regarding the operation of the state update logic 140. In an effort to control operation of the LPF 122, history data 123 may be referenced and used to control the LPF values applied in the feedback loop.

The approach to modifying the LPF 122 does not require scaling the filter output. Instead, the approach is to adjust the 'state' kept inside the filter history 123, such as in a memory coupled to the filter. Each change to auxiliary attenuation is applied as a change to the filter state, which permits a bypass to the slower control loop by applying gain changes instantly without affecting the control loop. In operation, this approach is like temporarily speeding-up the control loop to incorporate auxiliary attenuation immediately without interfering with the long-term, slower compression attenuation produced by the control loop. The filter state is modified whenever the value of the auxiliary attenuation changes. This modifies the filter history so the LPF can adjust to the detected changes immediately without a time lag.

The directly-adjustable time constant (Tc) is the Tc of the LPF. Because the LPF is in the feedback loop of the compressor, the LPF Tc directly relates to how quickly or slowly the audio level is adjusted. For that reason, the filter time constant may also be referred to as the compressor time constant.

It is common for compressor circuits in general to use a more complex filter with two time constants to separate ramping up and ramping down, but the example embodiment generally have a single time constant. Using separate up/down time constants may result in a design that failed burst signal tests.

The "filter state" is a digital signal processing term for values that need to be stored between calls to a difference equation. In this case, the difference equation result is stored because it is used in the next iteration of the difference equation. Pseudocode for a difference equation may provide: filter_state=0; // Initialize state. For each input: output=a*input–(1–a)*filter_state; filter_state=output. Changing the filter state provides modifying the value of filter_state in the pseudocode. Pseudocode modifying the value of filter_state by 10× provides: filter_state=filter_state*10. That operation would be inserted between iterations of the loop. It only occurs when there is a change in the auxiliary attenuation value. The filter state is scaled according to the negative of the derivative of the auxiliary attenuation. For example, if the auxiliary attenuation changes from 1 dB to 4 dB, that is a change of +3 dB. We would apply that as a –3 dB change to the filter_state. Note that filter_state is a linear power measurement, so –3 dB must be converted to the linear domain as: 10^(–3/10) =0.5 (approximately). Thus: filter_state=filter_state*0.5. The approach of modifying the filter state could be applicable to more complex filters than the one currently used.

The value of the differentiator 144 "z–1" represents a delay of one sample of audio. The antilog conversion 142 permits the sample to be applied directly to the LPF 122. The state update logic 140 uses the derivative of the auxiliary attenuation signal, produced by the differentiator 144, to determine how much the auxiliary attenuation value has changed since a previous sample. That change is converted to a linear scale factor and is used to scale the history (i.e., state) information 123 stored in the low-pass filter 122. If the auxiliary attenuation signal 104 is not changing over a period of time, the derivative is '0', which converts to a linear scale factor of '1'. In that case, the filter history has not changed since it is multiplied by '1'.

Figure 5:
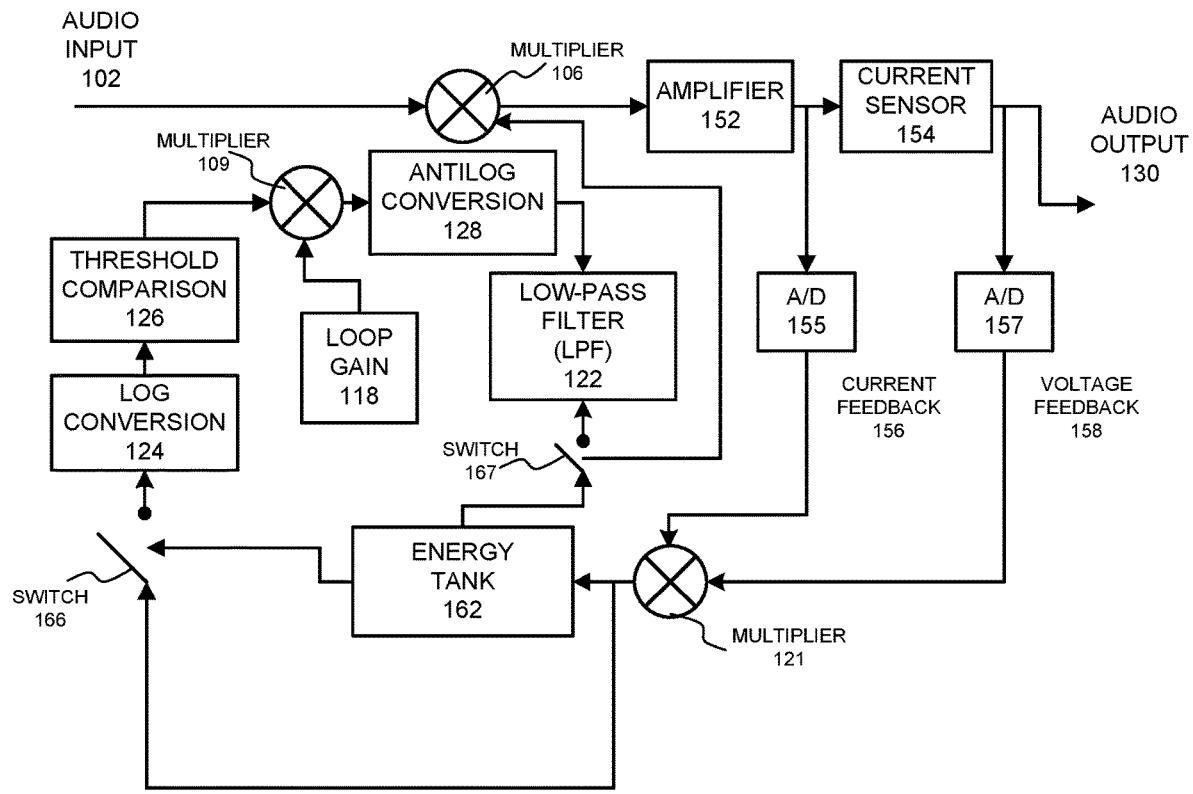
FIG. 5 illustrates a block diagram of a feedback compressor circuit for burst power waveforms with switch actuation and energy storage according to example embodiments.

FIG. 5 illustrates a block diagram of a feedback compressor circuit for burst power waveforms with switch actuation and energy storage according to example embodiments. Referring to FIG. 5, in an alternative approach to having the LPF at the front of the feedback chain process in an attempt to pass burst tests, another approach 500 is to utilize a compression circuit switch (on/off) so that the switch is 'on' when needed and 'off' when not needed depending on the energy level applied to the audio input signal. A way of determining when the compression feedback circuit is needed to amplify a signal is to identify when an audio channel is low on energy. Conceptually, this circuit may be considered as having a 'tank' of available energy, such as a configuration of bulk capacitors on a main supply source.

Referring to FIG. 5, the circuit may include additional features, such as an amplifier 152, analog to digital converters (A/Ds) 155 and 157, a current sensor 154, and feedback current 156 and feedback voltage 158. The multiplier 121 combines the signals sent to the energy tank 162, which can be switched on to the feedback loop of the compressor circuit via switch 166/167 under certain circumstances, for example, the "energy tank" 162 may represent amplifier energy in real time. For each audio sample over time, there are two operations to update the tank energy state. For example, by incrementing the energy state based on power provided into the amplifier 152 from a power source (not shown), and by decrementing an energy state based on the instantaneous output power measurement.

When the tank energy state drops below a minimum allowed energy tank energy threshold ($T_E$), this triggers the compressor circuit to be enabled 'on'. The compressor would be disabled after the tank recharges to a maximum allowed tank energy level ($T_{EMAX}$). This permits the time constant (Tc) to be separated from the time that it takes the compressor to start attenuating. The energy tank values determines when the compressor starts attenuating, and the low-pass filter values determines the time constant.

Figure 6:
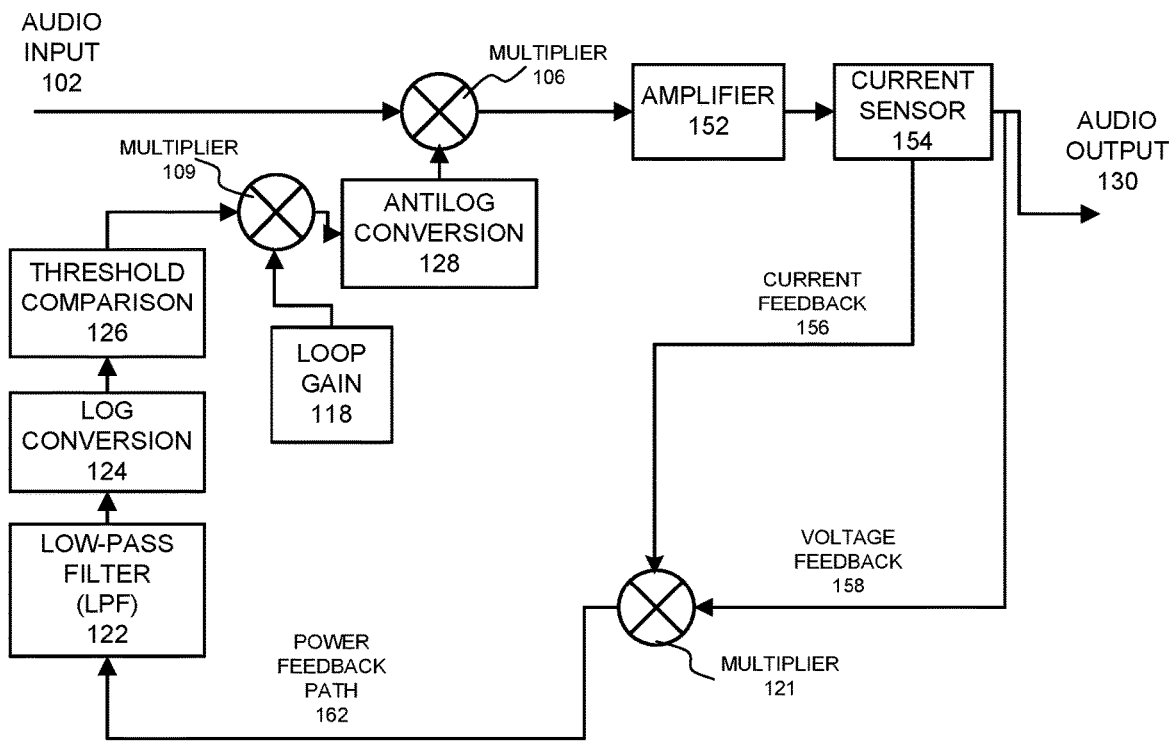
FIG. 6 illustrates a block diagram of a feedback compressor circuit with an applied amplifier power, according to example embodiments.

FIG. 6 illustrates a block diagram of a feedback compressor circuit with an applied amplifier power, according to example embodiments. Referring to FIG. 6, the configuration provides an example where the current feedback 156 and the voltage feedback 158 are multiplied via multiplier 121 to create a power feedback path 162 which is provided to the LPF 122. This provides a way to limit the amount of output power of the audio output signal 130. If the amount of power is too high then the threshold comparison module 126 may cause the signal to be modified depending on whether the power level exceeds the threshold.

Figure 7A:
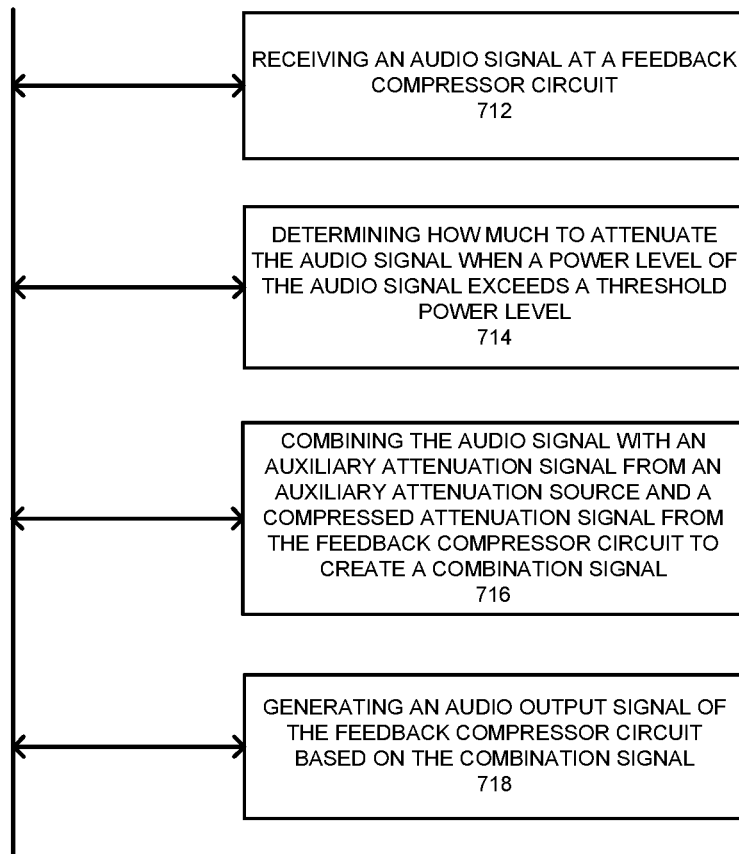
FIG. 7A illustrates an example method of operation of a feedback compressor and applied auxiliary attenuation according to example embodiments.

FIG. 7A illustrates an example method of operation of a feedback compressor and applied auxiliary attenuation according to example embodiments. Referring to FIG. 7A, the process 700 may include receiving an audio signal at a feedback compressor circuit 712, determining whether to attenuate the audio signal when a power level of the audio signal exceeds a threshold power level 714, combining the audio signal with an auxiliary attenuation signal from an auxiliary attenuation source and a compressed attenuation signal from the feedback compressor circuit to create a combination signal 716, and generating an audio output signal of the feedback compressor circuit based on the combination signal 718.

The auxiliary attenuation signal may include a composite of attenuation signals received from a plurality of sensors. The composite of attenuation signals may include one or more of an excessive heat signal, an excessive output current signal and a power supply voltage sag signal. The combining of the audio signal with the auxiliary attenuation signal provides one or more of multiplying the audio signal by the auxiliary attenuation signal, and converting the auxiliary attenuation signal to the log domain and adding the auxiliary attenuation signal to the compressed attenuation signal. The process also includes filtering the audio output signal via a low pass filter (LPF), providing a feedback signal to the LPF prior to combining the auxiliary attenuation signal and the compressed attenuation signal, and the feedback signal is used to combine the audio signal with the auxiliary attenuation signal and the compressed attenuation signal to create the combination signal, and wherein the combination signal is combined with the audio signal to create the audio output signal.

Figure 7B:
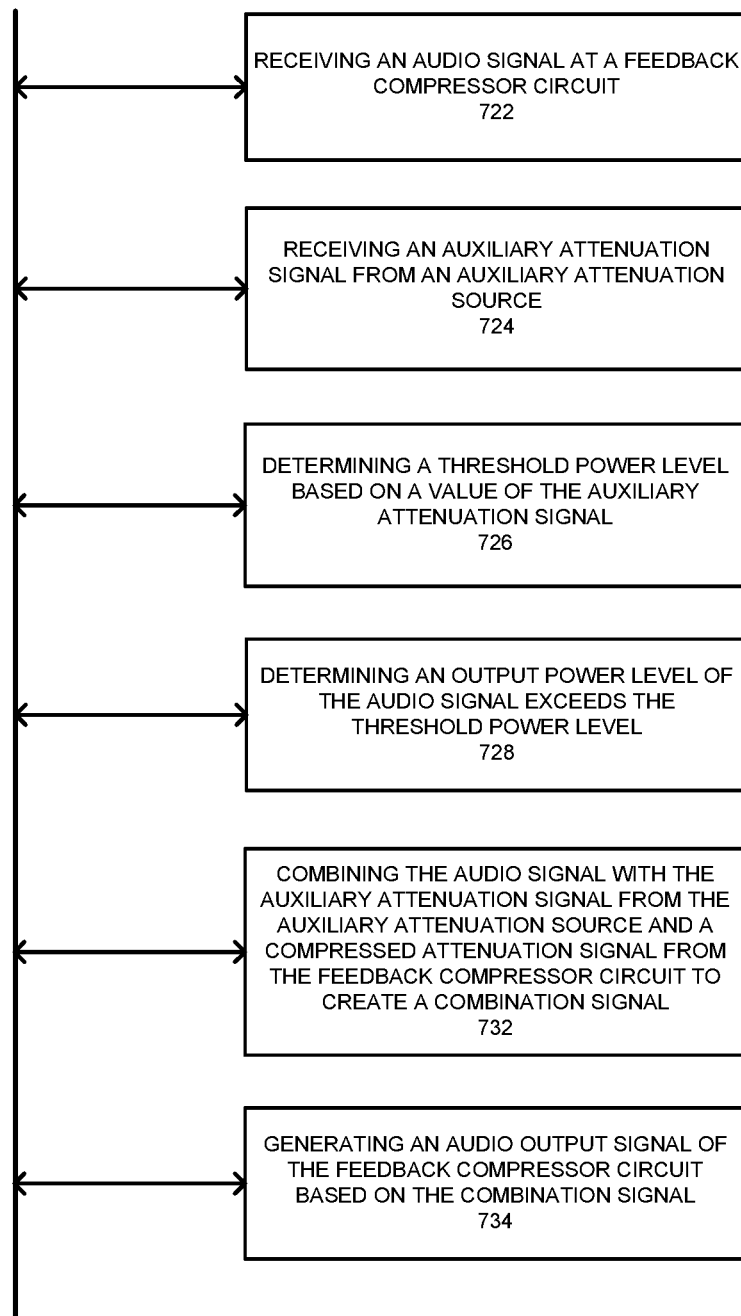
FIG. 7B illustrates an example method of operation of a feedback compressor, updated logic and auxiliary attenuation according to example embodiments.

FIG. 7B illustrates an example method of operation of a feedback compressor, updated logic and auxiliary attenuation according to example embodiments. Referring to FIG. 7B, the process 720 may include receiving an audio signal at a feedback compressor circuit 722, receiving an auxiliary attenuation signal from an auxiliary attenuation source 724, determining a threshold power level based on a value of the auxiliary attenuation signal 726, determining an output power level of the audio signal exceeds the threshold power level 728, combining the audio signal with the auxiliary attenuation signal from the auxiliary attenuation source and a compressed attenuation signal from the feedback compressor circuit to create a combination signal 732, and generating an audio output signal of the feedback compressor circuit based on the combination signal 734.

The process may also include dynamically adjusting a value of a low pass filter (LPF) based on a change to the threshold power level, and filtering the audio output signal via the low pass filter (LPF), dynamically adjusting a value of a low pass filter (LPF) based on a change to the threshold power level, and filtering the audio output signal via the low pass filter (LPF). The process may also include combining the filtered audio signal with the auxiliary attenuation signal from the auxiliary attenuation source and the compressed attenuation signal from the feedback compressor circuit to create the combination signal, and combining the combination signal with the audio signal to create the audio output signal. The process may further include performing a logarithmic conversion to the filtered audio signal prior to combining the filtered audio signal with the auxiliary attenuation signal, and performing an antilogarithmic conversion to the combination signal prior to combining the combination signal with the audio signal. The auxiliary attenuation signal may include a composite of attenuation signals received from a plurality of sensors configured to generate one or more of an excessive heat signal, an excessive output current signal and a power supply voltage sag signal.

Figure 7C:
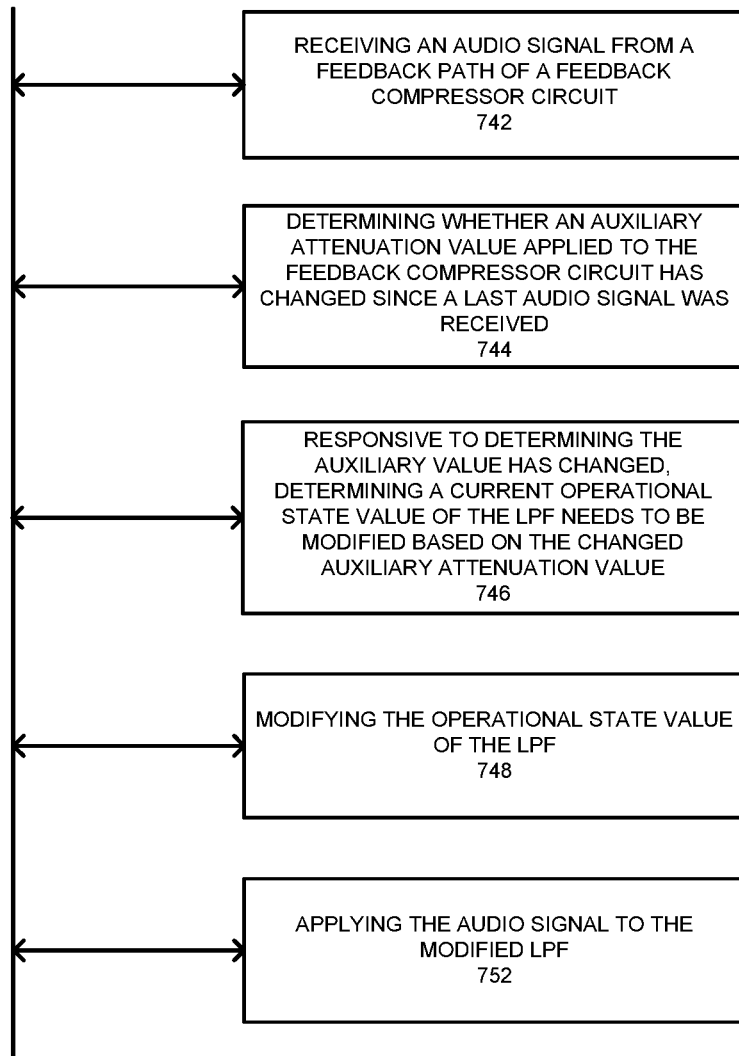
FIG. 7C illustrates an example method of operation of a feedback compressor, updated logic and LPF history for scaling and attenuation strategies, according to example embodiments.

FIG. 7C illustrates an example method of operation of a feedback compressor, updated logic and LPF history for scaling and attenuation strategies, according to example embodiments. Referring to FIG. 7C, the process 740 may include receiving an audio signal from a feedback path of a feedback compressor circuit 742, determining whether an auxiliary attenuation value applied to the feedback compressor circuit has changed since a last audio signal was received 744, responsive to determining the auxiliary value has changed, determining a current operational state value of the LPF needs to be modified based on the changed auxiliary attenuation value 746, modifying the operational state value of the LPF 748, and applying the audio signal to the modified LPF 752.

The process may also include determining the auxiliary attenuation value has changed, and responsive to determining the auxiliary attenuation value has changed, changing the operational state value of the LPF by a value that is directly proportional to the change in the auxiliary attenuation value, storing a plurality of operational state values of the LPF in a memory, and determining a derivative of the auxiliary attenuation value as a basis to modify the operational state value of the LPF. The process may also include delaying the audio signal by one audio sample prior to applying the audio signal to the LPF, and determining an anti-log conversion of the audio signal prior to applying the audio signal to the LPF, dynamically adjusting the operational state value of the LPF based on a change to a threshold power level, and filtering the audio output signal via the low pass filter (LPF). Also, the auxiliary attenuation signal may include a composite of attenuation signals received from a plurality of sensors configured to generate one or more of an excessive heat signal, an excessive output current signal and a power supply voltage sag signal.

Figure 7D:
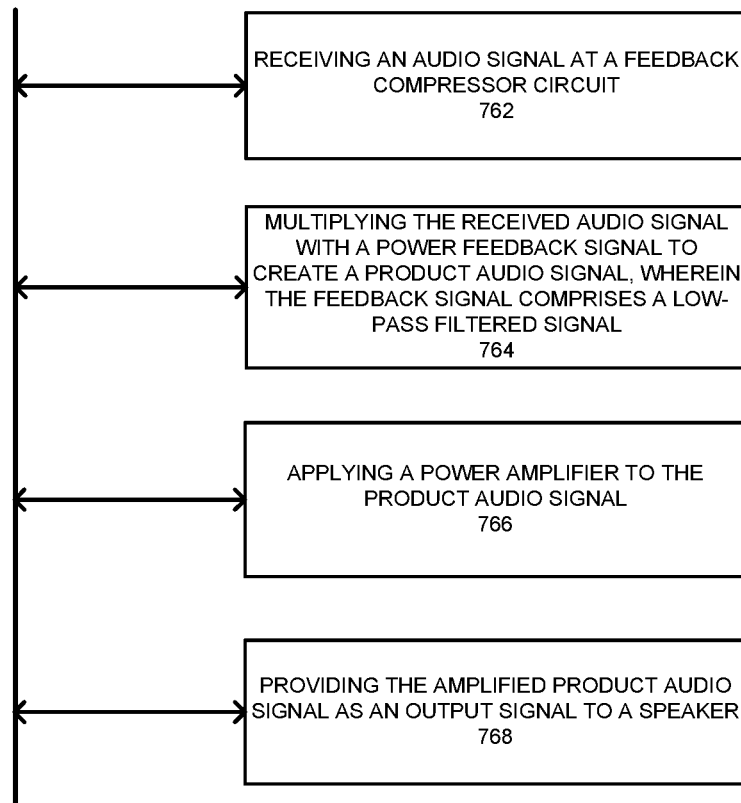
FIG. 7D illustrates an example method of operation of a feedback compressor with a power amplifier applied according to example embodiments.

FIG. 7D illustrates an example method of operation of a feedback compressor with a power amplifier applied according to example embodiments. Referring to FIG. 7D, the process 760 may include receiving an audio signal at a feedback compressor circuit 762, multiplying the received audio signal with a power feedback signal to create a product audio signal, wherein the feedback signal comprises a low-pass filtered signal 764, applying a power amplifier to the product audio signal 766, and providing the amplified product audio signal as an output signal to a speaker 768.

The process may also include multiplying a current feedback signal and a voltage feedback signal of the amplified product audio signal to create a power feedback signal, providing the power feedback signal to a low-pass filter to create the low-pass filtered signal, performing a threshold comparison of the low-pass filtered signal to a threshold value to determine whether an output signal power level is exceeding threshold value, and when the output signal power is exceeding the threshold value, subtracting the threshold value from the input signal level. The process may also include performing a logarithmic conversion of the low-pass filtered signal prior to performing the threshold comparison, and performing an antilogarithmic conversion to the power feedback signal prior to multiplying the power feedback signal with the received audio signal.

Another example process may include receiving an audio signal at a feedback compressor circuit, determining whether a power supply level of an energy source of the feedback compressor circuit has dropped below a power level threshold, determining whether to enable or disable a switch to activate the feedback compressor circuit based on whether the power supply level has dropped below the power level threshold, and applying power to the audio signal via the energy source. When the power supply level of the energy source has dropped below the power level threshold, the process provides for enabling the switch to activate the feedback compressor circuit, and when the power supply level of the energy source has increased beyond an energy source level threshold, enabling the switch to deactivate the feedback compressor circuit. In another example, the energy source of the feedback compressor circuit is a disposed in the feedback compressor circuit and includes a plurality of capacitors. The method may also include determining, via operation of the energy source, when the feedback compressor circuit experiences attenuation, and determining, via operation of a low pass filter (LPF) of the feedback compressor circuit, a compression time constant.

Figure 8:
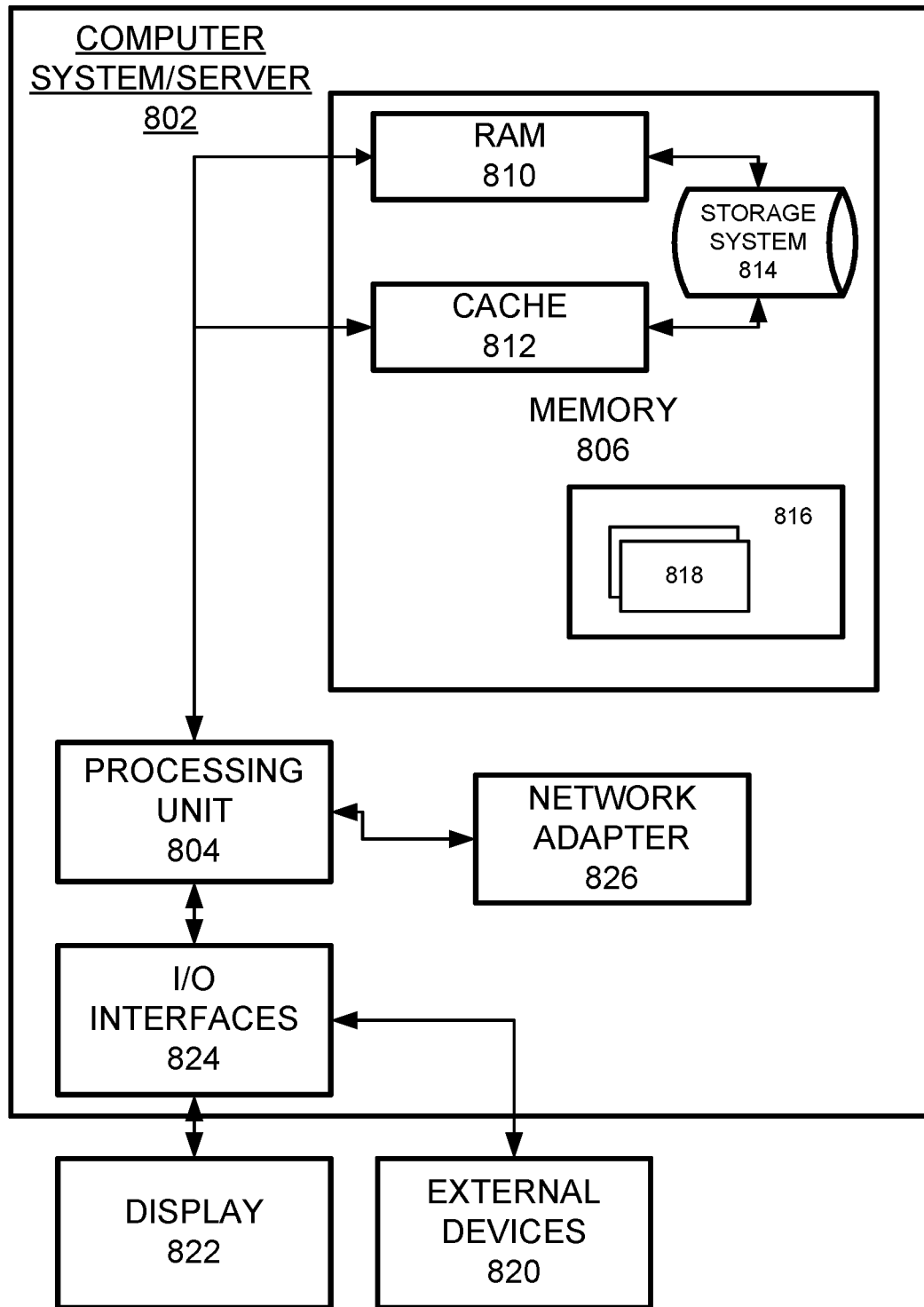
FIG. 8 illustrates an example computing entity configured to store instructions and executed operations associated with example embodiments of the application.

FIG. 8 illustrates an example computing entity configured to store instructions and executed operations associated with example embodiments of the application, such as an example network entity device configured to store instructions, software, and corresponding hardware for executing the same, according to example embodiments of the present application.

The operations of a method or algorithm described in connection with the embodiments disclosed herein may be embodied directly in hardware, in a computer program executed by a processor, or in a combination of the two. A computer program may be embodied on a computer readable medium, such as a storage medium. For example, a computer program may reside in random access memory ("RAM"), flash memory, read-only memory ("ROM"), erasable programmable read-only memory ("EPROM"), electrically erasable programmable read-only memory ("EEPROM"), registers, hard disk, a removable disk, a compact disk read-only memory ("CD-ROM"), or any other form of storage medium known in the art.

FIG. 8 is not intended to suggest any limitation as to the scope of use or functionality of embodiments of the application described herein. Regardless, the computing node 800 is capable of being implemented and/or performing any of the functionality set forth hereinabove.

In computing node 800 there is a computer system/server 802, which is operational with numerous other general purpose or special purpose computing system environments or configurations. Examples of well-known computing systems, environments, and/or configurations that may be suitable for use with computer system/server 802 include, but are not limited to, personal computer systems, server computer systems, thin clients, rich clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 802 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 802 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 8, computer system/server 802 in cloud computing node 800 is shown in the form of a general-purpose computing device. The components of computer system/server 802 may include, but are not limited to, one or more processors or processing units 804, a system memory 806, and a bus that couples various system components including system memory 806 to processor 804.

The bus represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 802 typically includes a variety of computer system readable media. Such media may be any available media that is accessible by computer system/server 802, and it includes both volatile and non-volatile media, removable and non-removable media. System memory 806, in one embodiment, implements the flow diagrams of the other figures. The system memory 806 can include computer system readable media in the form of volatile memory, such as random-access memory (RAM) 810 and/or cache memory 812. Computer system/server 802 may further include other removable/non-removable, volatile/non-volatile computer system storage media. By way of example only, storage system 814 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus by one or more data media interfaces. As will be further depicted and described below, memory 806 may include at least one program product having a set (e.g., at least one) of program modules that are configured to carry out the functions of various embodiments of the application.

Program/utility 816, having a set (at least one) of program modules 818, may be stored in memory 806 by way of example, and not limitation, as well as an operating system, one or more application programs, other program modules, and program data. Each of the operating system, one or more application programs, other program modules, and program data or some combination thereof, may include an implementation of a networking environment. Program modules 818 generally carry out the functions and/or methodologies of various embodiments of the application as described herein.

As will be appreciated by one skilled in the art, aspects of the present application may be embodied as a system, method, or computer program product. Accordingly, aspects of the present application may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present application may take the form of a computer program product embodied in one or more computer readable medium(s) having computer readable program code embodied thereon.

Computer system/server 802 may also communicate with one or more external devices 820 such as a keyboard, a pointing device, a display 822, etc.; one or more devices that enable a user to interact with computer system/server 802; and/or any devices (e.g., network card, modem, etc.) that enable computer system/server 802 to communicate with one or more other computing devices. Such communication can occur via I/O interfaces 824. Still yet, computer system/server 802 can communicate with one or more networks such as a local area network (LAN), a general wide area network (WAN), and/or a public network (e.g., the Internet) via network adapter 826. As depicted, network adapter 826 communicates with the other components of computer system/server 802 via a bus. It should be understood that although not shown, other hardware and/or software components could be used in conjunction with computer system/server 802. Examples include, but are not limited to: microcode, device drivers, redundant processing units, external disk drive arrays, RAID systems, tape drives, and data archival storage systems, etc.

Although an exemplary embodiment of at least one of a system, method, and non-transitory computer readable medium has been illustrated in the accompanied drawings and described in the foregoing detailed description, it will be understood that the application is not limited to the embodiments disclosed, but is capable of numerous rearrangements, modifications, and substitutions as set forth and defined by the following claims. For example, the capabilities of the system of the various figures can be performed by one or more of the modules or components described herein or in a distributed architecture and may include a transmitter, receiver or pair of both. For example, all or part of the functionality performed by the individual modules, may be performed by one or more of these modules. Further, the functionality described herein may be performed at various times and in relation to various events, internal or external to the modules or components. Also, the information sent between various modules can be sent between the modules via at least one of: a data network, the Internet, a voice network, an Internet Protocol network, a wireless device, a wired device and/or via plurality of protocols. Also, the messages sent or received by any of the modules may be sent or received directly and/or via one or more of the other modules.

One skilled in the art will appreciate that a "system" could be embodied as a personal computer, a server, a console, a personal digital assistant (PDA), a cell phone, a tablet computing device, a smartphone or any other suitable computing device, or combination of devices. Presenting the above-described functions as being performed by a "system" is not intended to limit the scope of the present application in any way but is intended to provide one example of many embodiments. Indeed, methods, systems and apparatuses disclosed herein may be implemented in localized and distributed forms consistent with computing technology.

It should be noted that some of the system features described in this specification have been presented as modules, in order to more particularly emphasize their implementation independence. For example, a module may be implemented as a hardware circuit comprising custom very large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, comprise one or more physical or logical blocks of computer instructions that may, for instance, be organized as an object, procedure, or function. Nevertheless, the executables of an identified module need not be physically located together but may comprise disparate instructions stored in different locations which, when joined logically together, comprise the module and achieve the stated purpose for the module. Further, modules may be stored on a computer-readable medium, which may be, for instance, a hard disk drive, flash device, random access memory (RAM), tape, or any other such medium used to store data.

Indeed, a module of executable code could be a single instruction, or many instructions, and may even be distributed over several different code segments, among different programs, and across several memory devices. Similarly, operational data may be identified and illustrated herein within modules and may be embodied in any suitable form and organized within any suitable type of data structure. The operational data may be collected as a single data set or may be distributed over different locations including over different storage devices, and may exist, at least partially, merely as electronic signals on a system or network.

It will be readily understood that the components of the application, as generally described and illustrated in the figures herein, may be arranged and designed in a wide variety of different configurations. Thus, the detailed description of the embodiments is not intended to limit the scope of the application as claimed but is merely representative of selected embodiments of the application.

One having ordinary skill in the art will readily understand that the above may be practiced with steps in a different order, and/or with hardware elements in configurations that are different than those which are disclosed. Therefore, although the application has been described based upon these preferred embodiments, it would be apparent to those of skill in the art that certain modifications, variations, and alternative constructions would be apparent.

While preferred embodiments of the present application have been described, it is to be understood that the embodiments described are illustrative only and the scope of the application is to be defined solely by the appended claims when considered with a full range of equivalents and modifications (e.g., protocols, hardware devices, software platforms etc.) thereto.

What is claimed is:

1. A method comprising:
   receiving an audio signal from a feedback path of a feedback compressor circuit;
   determining whether an auxiliary attenuation value applied to the feedback compressor circuit has changed since a last audio signal was received;
   responsive to determining the auxiliary attenuation value has changed, determining a current operational state value of a low pass filter (LPF) needs to be modified;
   responsive to determining the auxiliary attenuation value has increased or decreased, changing the operational state value of the LPF by a value that is directly proportional to the change in the auxiliary attenuation value;
   modifying the current operational state value of the LPF; and
   applying the audio signal to the modified LPF.

2. The method of claim 1, comprising:
   storing a plurality of operational state values of the LPF in a memory.

3. The method of claim 2, comprising:
   determining a derivative of the auxiliary attenuation value as a basis to modify the operational state value of the LPF.

4. The method of claim 1, comprising:
   determining an anti-log conversion of the audio signal prior to applying the audio signal to the LPF.

5. The method of claim 1, comprising:
   dynamically adjusting the operational state value of the LPF based on a change to a threshold power level; and
   filtering the audio signal via LPF.

6. The method of claim 1, wherein the auxiliary attenuation signal comprises a composite of attenuation signals received from a plurality of sensors configured to generate one or more of an excessive heat signal, an excessive output current signal and a power supply voltage sag signal.

7. An apparatus comprising:
   a receiver configured to receive an audio signal from a feedback path of a feedback compressor circuit;
   a processor configured to determine whether an auxiliary attenuation value applied to the feedback compressor circuit has changed since a last audio signal was received;

responsive to the determination that the auxiliary attenuation value has changed, determine a current operational state value of a low pass filter (LPF) needs to be modified;

responsive to a determination that the auxiliary attenuation value has increased or decreased, change the operational state value of the LPF by a value that is directly proportional to the change in the auxiliary attenuation value;

modify the current operational state value of the LPF; and apply the audio signal to the modified LPF.

8. The apparatus of claim 7, wherein the processor is further configured to store a plurality of operational state values of the LPF in a memory.

9. The apparatus of claim 8, wherein the processor is further configured to determine a derivative of the auxiliary attenuation value as a basis to modify the operational state value of the LPF.

10. The apparatus of claim 7, wherein the processor is further configured to determine an anti-log conversion of the audio signal prior to applying the audio signal to the LPF.

11. The apparatus of claim 7, wherein the processor is further configured to dynamically adjust the operational state value of the LPF based on a change to a threshold power level; and filter the audio signal via the LPF.

12. The apparatus of claim 7, wherein the auxiliary attenuation signal comprises a composite of attenuation signals received from a plurality of sensors configured to generate one or more of an excessive heat signal, an excessive output current signal and a power supply voltage sag signal.

13. A non-transitory computer readable storage medium configured to store instructions that when executed cause a processor to perform:

receiving an audio signal from a feedback path of a feedback compressor circuit;

determining whether an auxiliary attenuation value applied to the feedback compressor circuit has changed since a last audio signal was received;

responsive to determining the auxiliary attenuation value has changed, determining a current operational state value of a low pass filter (LPF) needs to be modified;

responsive to determining the auxiliary attenuation value has increased or decreased, changing the operational state value of the LPF by a value that is directly proportional to the change in the auxiliary attenuation value;

modifying the current operational state value of the LPF; and applying the audio signal to the modified LPF.

14. The non-transitory computer readable storage medium of claim 13, wherein the processor is further configured to perform:

storing a plurality of operational state values of the LPF in a memory.

15. The non-transitory computer readable storage medium of claim 14, wherein the processor is further configured to perform:

determining a derivative of the auxiliary attenuation value as a basis to modify the operational state value of the LPF.

16. The non-transitory computer readable storage medium of claim 13, wherein the processor is further configured to perform:

determining an anti-log conversion of the audio signal prior to applying the audio signal to the LPF.

17. The non-transitory computer readable storage medium of claim 13, wherein the processor is further configured to perform:

dynamically adjusting the operational state value of the LPF based on a change to a threshold power level; and filtering the audio signal via the LPF.

* * * * *